United States Patent
Jo et al.

(10) Patent No.: US 11,336,296 B2
(45) Date of Patent: May 17, 2022

(54) CONTROLLER AND MEMORY SYSTEM HAVING THE CONTROLLER

(71) Applicant: SK hynix Inc., Gyeonggi-do (KR)

(72) Inventors: Myung Jin Jo, Gyeonggi-do (KR); Kwang Hyun Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/088,939

(22) Filed: Nov. 4, 2020

(65) Prior Publication Data
US 2021/0367614 A1 Nov. 25, 2021

(30) Foreign Application Priority Data
May 20, 2020 (KR) .................. 10-2020-0060557

(51) Int. Cl.
*H03M 13/09* (2006.01)
*H03M 13/11* (2006.01)
*G06F 3/06* (2006.01)

(52) U.S. Cl.
CPC ........ *H03M 13/095* (2013.01); *G06F 3/0619* (2013.01); *G06F 3/0659* (2013.01); *G06F 3/0679* (2013.01); *H03M 13/1111* (2013.01); *H03M 13/1128* (2013.01)

(58) Field of Classification Search
CPC .................................................. H03M 13/095
See application file for complete search history.

(56) References Cited

U.S. PATENT DOCUMENTS

| | | | |
|---|---|---|---|
| 2017/0070243 A1* | 3/2017 | Hung | H03M 13/3753 |
| 2018/0013451 A1* | 1/2018 | Kaynak | H03M 13/1128 |
| 2020/0004629 A1* | 1/2020 | Zamir | G06F 3/0619 |
| 2020/0042385 A1* | 2/2020 | Hwang | G11C 29/52 |

FOREIGN PATENT DOCUMENTS

| | | |
|---|---|---|
| KR | 10-1466270 | 11/2014 |
| KR | 10-2015-0020902 | 2/2015 |
| KR | 10-2016-0046467 | 4/2016 |

* cited by examiner

*Primary Examiner* — Fritz Alphonse
(74) *Attorney, Agent, or Firm* — IP & T Group LLP

(57) ABSTRACT

The present technology includes a controller and a memory system including the same. The controller includes a memory interface configured to receive a codeword from a memory device, and an error correction circuit configured to: perform an error correction decoding operation on the codeword received from the memory interface, compare a number of unsatisfied check nodes (UCNs) detected in the error correction decoding operation with a reference number, perform or stop the error correction decoding operation on the codeword according to a result of comparing the number of UCNs and the reference number, and output a retransmission request signal of the codeword to the memory interface in response to the result, wherein the memory interface requests the codeword to the memory device in response to the retransmission request signal.

20 Claims, 9 Drawing Sheets

$$H = \begin{bmatrix} 1 & 0 & 1 & 0 & 1 & 0 & 0 \\ 0 & 1 & 0 & 1 & 0 & 1 & 0 \\ 1 & 0 & 0 & 1 & 0 & 0 & 1 \end{bmatrix}$$

FIG. 9

$$\underbrace{\begin{bmatrix} 1 & 0 & 1 & 0 & 1 & 0 & 0 \\ 0 & 1 & 0 & 1 & 0 & 1 & 0 \\ 1 & 0 & 0 & 1 & 0 & 0 & 1 \end{bmatrix}}_{H} \times \underbrace{\begin{bmatrix} C_{i1} \\ C_{i2} \\ C_{i3} \\ \vdots \\ C_{i7} \end{bmatrix}}_{C_i^T} = \underbrace{\begin{bmatrix} S_{i1} \\ S_{i2} \\ S_{i3} \end{bmatrix}}_{S_i}$$

FIG. 10

| | Si1 | Si2 | Si3 | |
|---|---|---|---|---|
| | 0 | 0 | 0 | ←pass |
| UCN | (1) | 0 | 0 | ←fail (UCN#=1) |
| | (1) | 0 | (1) | ←fail (UCN#=2) |
| | UCN | | UCN | |

CONTROLLER AND MEMORY SYSTEM HAVING THE CONTROLLER

CROSS-REFERENCE TO RELATED APPLICATION

The present application claims priority under 35 U.S.C. § 119(a) to Korean patent application number 10-2020-0060557, filed on May 20, 2020, which is incorporated herein by reference in its entirety.

BACKGROUND

Field of Invention

The present disclosure relates to a controller and a memory system including the same, and more particularly, to a controller capable of detecting error(s) in data output from a memory device and recovering the error(s), and a memory system including the same.

Description of Related Art

A memory system may include a memory device capable of storing data and a controller capable of controlling the memory device according to a request of a host. For example, the controller may program data provided from the host in the memory device, read data stored in the memory device and output the read data to the host. The controller may include an error correction circuit to ensure reliability of data. The error correction circuit may perform encoding and decoding using an error correction code. For example, the error correction circuit may include an error correction encoder that encodes data provided from the host, and an error correction decoder that decodes data read from the memory device. The data provided from the host may be a message, and data read from the memory device may be a codeword.

SUMMARY

An embodiment of the present disclosure provides a controller capable of sensing an error while data corresponding to a selected address is transmitted and selectively retransmitting the data in which the error is generated, and a memory system including the controller.

A controller according to an embodiment of the present disclosure includes a memory interface configured to receive a codeword from a memory device, and an error correction circuit configured to: perform an error correction decoding operation on the codeword received from the memory interface, compare a number of unsatisfied check nodes (UCNs) detected in the error correction decoding operation with a reference number, perform or stop the error correction decoding operation on the codeword according to a result of comparing the number of UCNs and the reference number, and output a retransmission request signal of the codeword to the memory interface in response to the result, wherein the memory interface requests the codeword to the memory device in response to the retransmission request signal.

A memory system according to an embodiment of the present disclosure includes a memory device configured to store data including a codeword, and a controller configured to control the memory device. The controller includes a memory interface configured to receive the codeword from the memory device, and an error correction circuit configured to: perform an error correction decoding operation on the codeword received from the memory interface, compare a number of unsatisfied check nodes (UCNs) detected in the error correction decoding operation with a reference number, perform or stop the error correction decoding operation on the codeword according to a result of comparing the number of UCNs and the reference number, output a retransmission request signal of the codeword when the error correction decoding operation is stopped, and the memory interface requests first data of the codeword to the memory device in response to the retransmission request signal.

An embodiment of the present disclosure may provide for a method of operating a controller. The method may include controlling a memory device to read therefrom a codeword comprising data pieces, performing an error correction decoding operation on each of the data pieces, controlling, when a number of unsatisfied check nodes is greater than a threshold as a result of performing the error correction decoding operation on a target data piece among the data pieces, the memory device to read therefrom the target data piece, and performing the error correction decoding operation on the target data piece again.

The present technology may selectively retransmit data in which an error is detected when the error is detected in the data received from the memory device, and thus a time of a read operation may be shortened.

BRIEF DESCRIPTION OF THE DRAWINGS

FIG. 9 is a diagram illustrating a method of generating a symbol using the parity check matrix shown in FIG. 7.

FIG. 10 is a diagram illustrating symbols and an unsatisfied check node (UCN) according to an embodiment of the present disclosure.

DETAILED DESCRIPTION

Figure 1A:
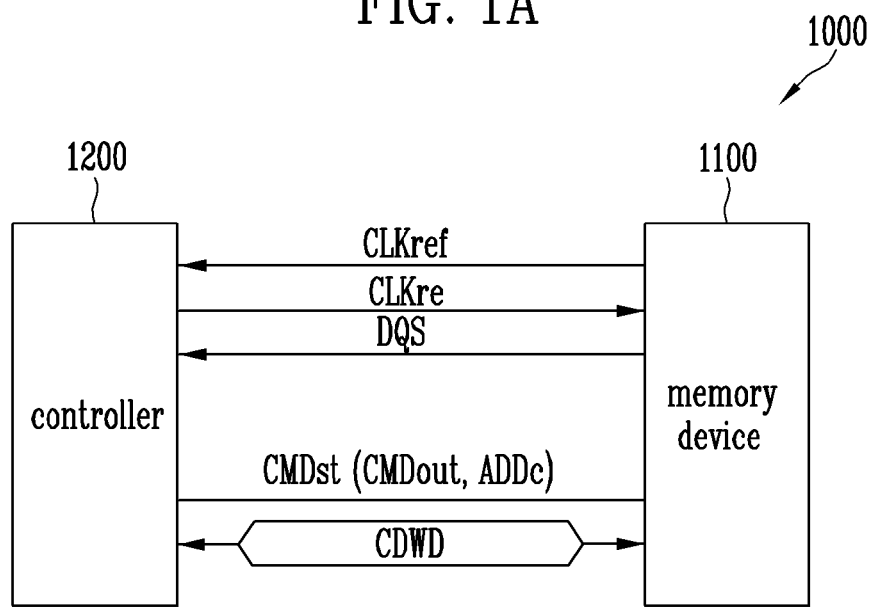
FIG. 1A is a diagram illustrating a memory system according to an embodiment of the present disclosure.

FIG. 1A is a diagram illustrating a memory system according to an embodiment of the present disclosure.

Referring to FIG. 1A, the memory system 1000 may include a memory device 1100 capable of storing data and a controller 1200 capable of controlling the memory device 1100 according to a request from an external device. For example, the controller 1200 may generate a command for controlling the memory device 1100 according to a request of a host, and map and manage an address between the host and the memory device 1100.

The memory device 1100 may communicate with the controller 1200 through a channel. The memory device 1100 may be implemented as a volatile memory or a non-volatile memory. In a volatile memory stored data is lost when supply of power is cut off, whereas in a non-volatile memory data is retained even though supply of power is cut off. The description below is given in the context in which the memory device 1100 is implemented as a non-volatile memory, as an example.

The controller 1200 may control the memory device 1100 according to the request of the host, but may perform a background operation for performance improvement of the memory system 1000 even without a request from the host. When the host requests a read operation, the controller may generate a read command corresponding to the read request, find a physical address mapped to a logical address received from the host, and then transmit the read command and the physical address to the memory device 1100.

The memory device 1100 may perform a read operation on memory cells of a page corresponding to the physical address in response to the read command. Here, a page may be a group of memory cells connected to the same word line among memory cells included in a memory block.

When a codeword CDWD is read from memory cells selected in the memory device 1100, the controller 1200 may transmit an output command CMDout to the memory device 1100, and the memory device 1100 may output the codeword CDWD through input/output lines in response to the output command CMDout. Here, the input/output lines may be some of lines of which the channel is comprised.

The controller 1200 may detect an error by performing an error correction decoding operation on data output from the memory device 1100. For example, the data output from the memory device 1100 and transmitted to the controller 1200 may be the codeword CDWD, and data output by decoding the codeword CDWD may be a message.

During a read operation, the memory device 1100 and the controller 1200 may output and receive the codeword CDWD in response to a read clock CLKre and a data strobe clock DQS input and output in response to a reference clock CLKref. For example, the memory device 1100 may output the reference clock CLKref, and the controller 1200 may output a read clock CLKre in response to the reference clock CLKref. The memory device 1100 may receive the read clock CLKre in response to the reference clock CLKref, generate the same data strobe clock DQS as the received read clock CLKre, and output the codeword CDWD.

The memory device 1100 may not output all codewords CDWD of a selected page at one time, and instead may output data in a chunk unit less than a page unit, and may output data in a unit less than a chunk according to an address. For example, the memory device 1100 may output data in an error correction unit having a size less than the chunk according to an address received from the controller 1200.

The controller 1200 according to an embodiment may correct the error and output the message when the number of errors detected during a decoding operation of the data received from the memory device 1100 is less than a reference number, which may represent a maximum number of errors that are correctable.

When the number of errors detected in the data received from the memory device 1100 is greater than the reference number, the controller 1200, according to an embodiment, may determine that an error has occurred in a process of transmitting data from the memory device 1100 to the controller 1200. Therefore, the controller 1200 may perform the error correction decoding operation for detecting error(s) in data in the error correction unit among data received from the memory device 1100. When the number of errors detected in the error correction decoding operation is greater than the reference number, the controller 1200 may output a command set CMDst including a column address ADDc corresponding to the error correction unit in which the errors are detected and an output command CMDout to the memory device 1100. The column address ADDc may be an address divided in the error correction unit and may be an address of a column including the error.

The memory device 1100 may select data the size of an error correction unit corresponding to the column address ADDc representing a column, and output the selected error correction unit data in response to the output command CMDout. That is, when the number of errors detected in the error correction decoding operation greater than a reference number, the controller 1200 may transmit the column address ADDc divided into the error correction unit to the memory device 1100 so that only the error correction unit data corresponding to the column address ADDc and stored in the column may be selectively output again. An error may occur for various reasons; one such reason is when the read clock CLKre or the data strobe clock DQS disappears in a transmission process. In that case, an error may occur in the codeword CDWD. In general, the controller 1200 receives all codewords CDWD, which are targets of the read operation, from the memory device 1100, and receives all codewords CDWD (each having a size of a page) from the memory device 1100 again when the error occurs in any of the codewords CDWD. However, in an embodiment, when the controller 1200 detects the error in an error correction unit and the number of detected errors is greater than the reference value, the codeword CDWD of the error correction unit may be requested again from the memory device 1100. As described above, when the error occurs, the time to perform the read operation may be shortened by requesting and outputting again not the entire undivided codeword representing an entire page unit, but only the codeword of the error correction unit in which the error(s) occurred.

Figure 1B:
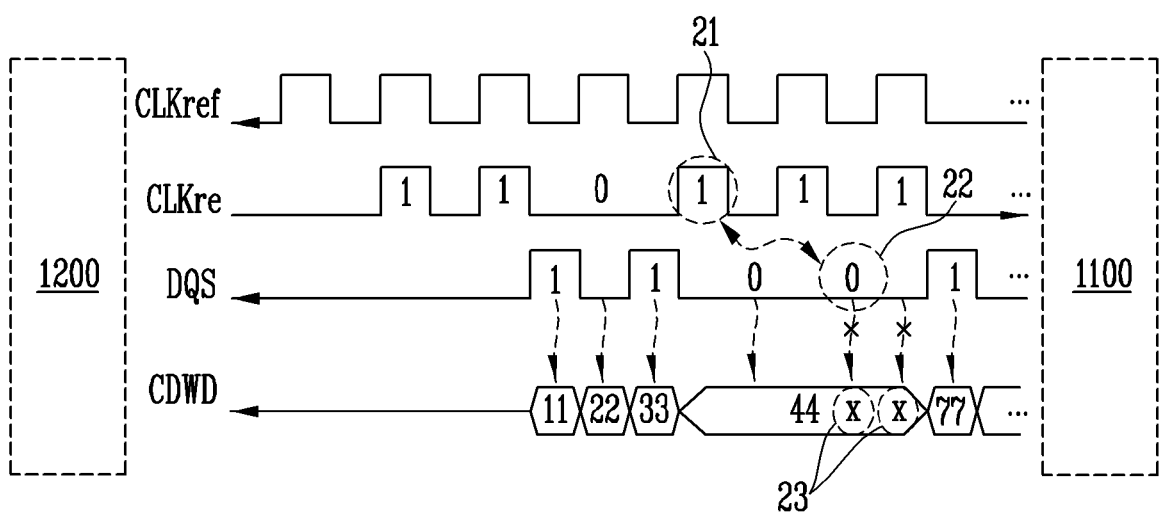
FIG. 1B is a diagram illustrating occurrence of an error during a read operation.

FIG. 1B is a diagram illustrating an error that may occur during the read operation.

Referring to FIG. 1B, during the read operation, the memory device 1100 may output the reference clock CLKref. The controller 1200 may output the read clock CLKre in synchronization with the reference clock CLKref. The memory device 1100 may output the codeword CDWD in response to the read clock CLKre. The memory device 1100 may output the codeword CDWD in synchronization with the data strobe clock DQS. For example, the memory device 1100 may generate the same data strobe clock DQS as the read clock CLKre received from the controller 1200, and sequentially output the codeword CDWD in response to the data strobe clock DQS. That is, the codeword CDWD may be output whenever a phase of the data strobe clock DQS is changed. Therefore, the data strobe clock DQS is synchronized with the read clock CLKre.

However, when a portion 22 of the data strobe clock DQS is lost in the memory device 1100 or the channel, the controller 1200 may receive a variation of an original codeword CDWD that was sent. For example, the memory device 1100 may output the codeword CDWD whenever the phase of the data strobe clock DQS is changed. However, when a clock segment 21 of which a phase is changed in the read clock CLKre is output, a codeword CDWD containing data different from original data may be output to the controller 1200 as a result of the changed portion 22 of the data strobe clock DQS. For example, when the read clock CLKre is output in a sequence of 110111, the data strobe clock DQS is to be also output in the sequence of 110111, but the portion 22 corresponding to a third codeword CDWD (33) and portion 21 of the read clock CLKre 22 may be lost in the data strobe clock DQS. Therefore, a fourth (44) codeword CDWD is output and then fifth (55) and sixth (66) codewords CDWD are to be output 23, but the fourth (44) codeword CDWD and a seventh (77) codeword CDWD may be sequentially output due to the lost portion or malfunctioning of the data strobe clock DQS.

The controller 1200 may compare the output read clock CLKre with the received data strobe clock DQS, determine a result of the comparison, and request the memory device 1100 to retransmit a corresponding codeword when the clocks are not properly aligned.

Figure 2:
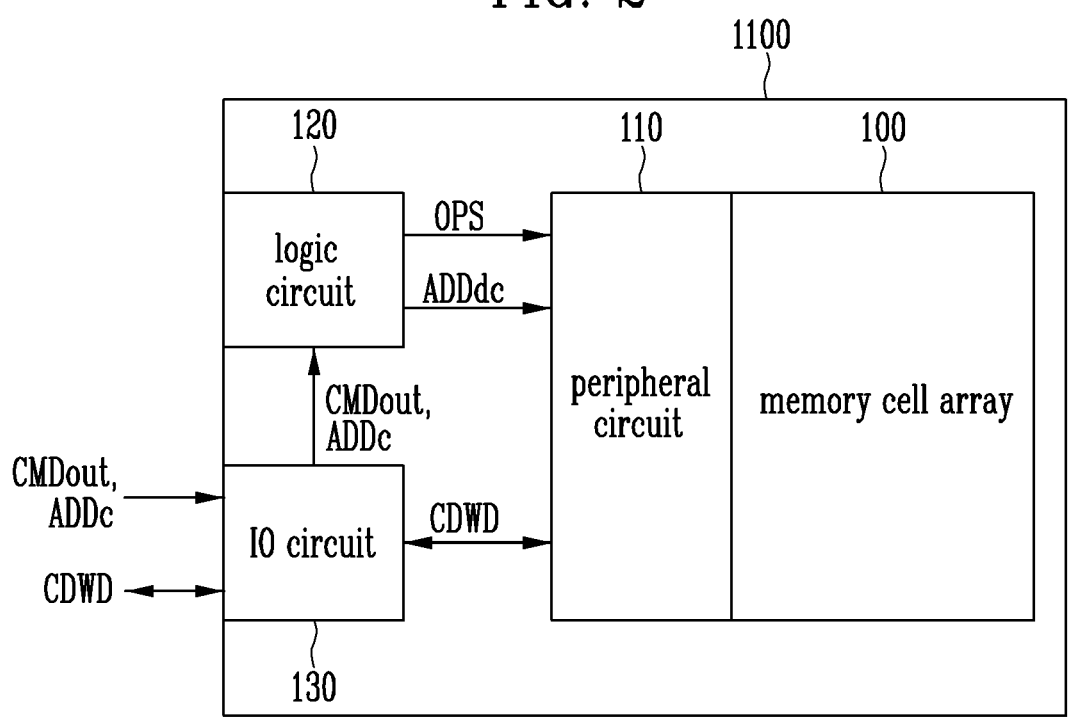
FIG. 2 is a diagram illustrating a memory device, such as that shown in FIG. 1.

FIG. 2 is a diagram illustrating the memory device shown in FIG. 1.

Referring to FIG. 2, the memory device 1100 may include a memory cell array 100, a peripheral circuit 110, a logic circuit 120, and an input/output (IO) circuit 130.

The memory cell array 100 may include a plurality of memory blocks, each of which may include a plurality of memory cells. The plurality of memory blocks may be implemented in a two-dimensional or three-dimensional structure. For example, in the two-dimensional structure, the memory cells may be arranged in a direction parallel to a substrate, and in the three-dimensional structure, the memory cells may be stacked in a I direction perpendicular to the substrate.

The peripheral circuit 110 may program the codeword CDWD in the memory cell array 100 under control of the logic circuit 120 or read the codeword CDWD from the memory cell array 100. For example, the peripheral circuit 110 may output data read from the memory cell array 100 according to operation signals OPS output from the logic circuit 120 and a decoded address ADDdc. For example, the peripheral circuit 110 may output data included in a selected section among the read data according to the decoded address ADDdc.

The logic circuit 120 may output the operation signals OPS and an address for controlling the peripheral circuit 110 in response to a command and an address. For example, when the output command CMDout and the column address ADDc are received, the logic circuit 120 may decode the column address ADDc to output the decoded address ADDdc, and output the operation signals OPS in response to the output command CMDout. The peripheral circuit 110 may output the codeword CDWD read from the memory cell array 100 in response to the operation signals OPS and the decoded address ADDdc.

When the command and the address output from the controller 1200 of FIG. 1 are input, the input/output circuit 130 may transmit the command and the address to the logic circuit 120, and transmit the codeword CDWD output from the controller 1200 to the peripheral circuit 110. For example, when the output command CMDout and the column address ADDc are received, the input/output circuit 130 may transmit the output command CMDout and the column address ADDc to the logic circuit 120, and when the codeword CDWD is received from the peripheral circuit 110, the input/output circuit 130 may output the codeword CDWD to the controller 1200. That is, the output command CMDout may be a command for outputting the read data to the controller 1200 after the data read from the page selected by the read command is stored in the peripheral circuit 110. Data selected according to the decoded address ADDdc among data stored in the peripheral circuit 110 may be output.

Figure 3:
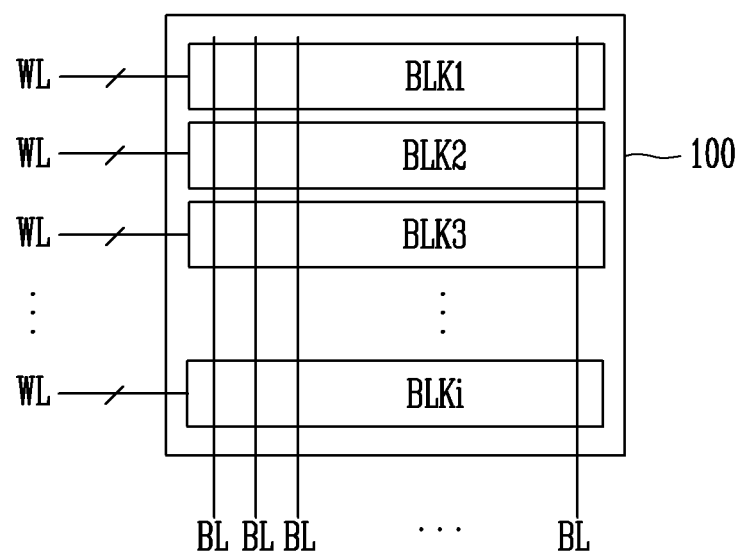
FIG. 3 is a diagram illustrating a memory cell array, such as that shown in FIG. 2.

FIG. 3 is a diagram illustrates the memory cell array shown in FIG. 2.

Referring to FIG. 3, the memory cell array 100 may include a plurality of memory blocks BLK1 to BLKi (i is a positive integer). The plurality of memory blocks BLK1 to BLKi may be configured to be identical to each other, and may be implemented in a two-dimensional or three-dimensional structure. The plurality of memory blocks BLK1 to BLKi may be connected to different word lines WL, and may be commonly connected to bit lines BL.

Figure 4:
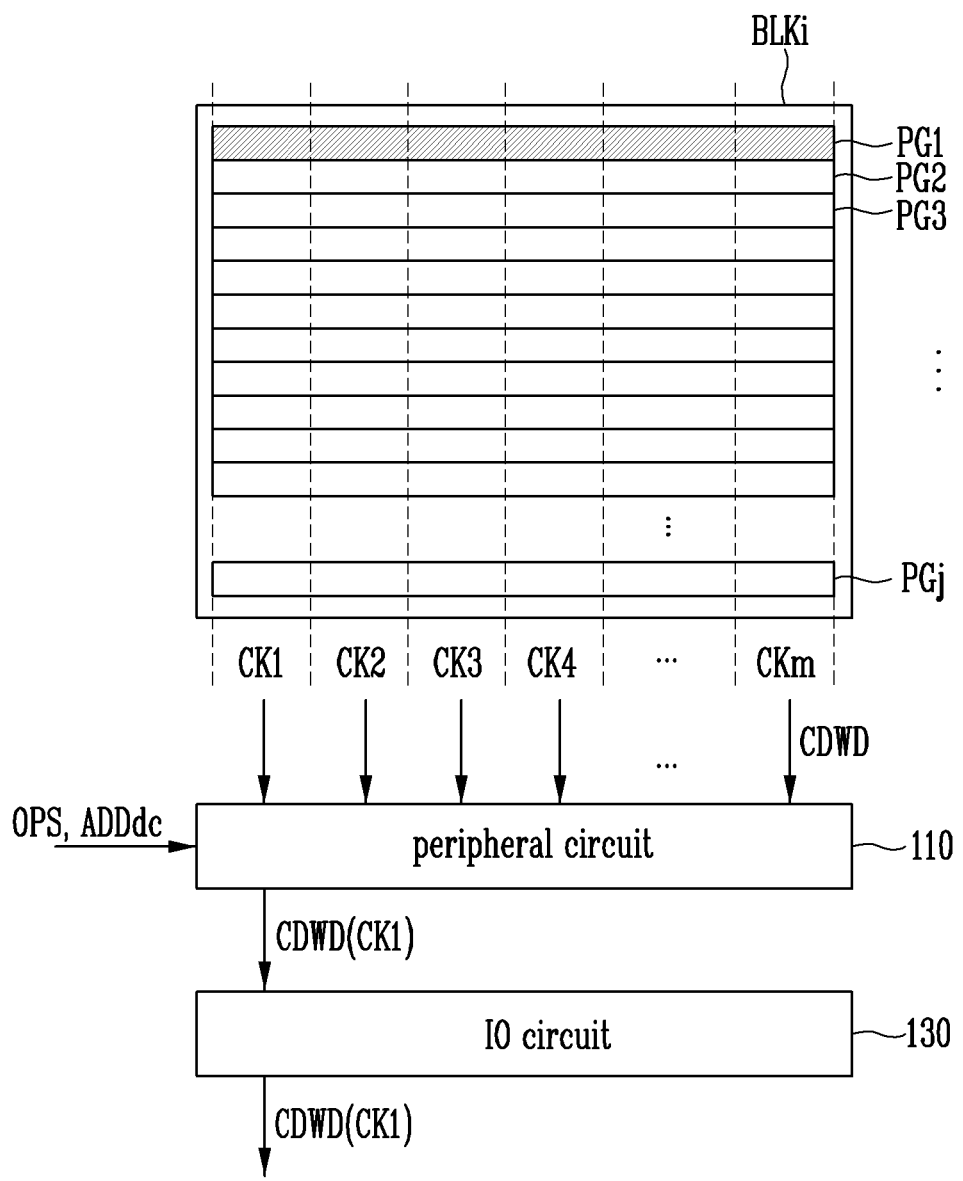
FIG. 4 is a diagram illustrating an operation in which a codeword is output from the memory device during a read operation.

FIG. 4 is a diagram illustrating an operation in which the codeword is output from the memory device during the read operation.

Referring to FIG. 4, an i-th memory block BLKi among the plurality of memory blocks BLK1 to BLKi shown in FIG. 3 is described as an example.

The i-th memory block BLKi may include a plurality of pages PG1 to PGj (j is a positive integer). A page is a group of memory cells connected to the same word line. During the read operation, memory cells included in a page selected from the plurality of pages PG1 to PGj may be read. As the capacity of the i-th memory block BLKi gradually increases, the capacity of each of the plurality of pages PG1 to PGj also increases. The capacity of each of the plurality of pages PG1 to PGj may be the same. When each of the plurality of pages PG1 to PGj reaches a certain capacity, the peripheral circuit 110 may not transmit all read data to the input/output circuit 130, and instead may transmit data in units, each of which is a size that is less than a size of the entire page. That is, a page of data may be subdivided into multiple units of data. For example, each of the plurality of pages PG1 to PGj may be divided into chunk units, and the peripheral circuit 110 may output data in the chunk unit according to the decoded address ADDdc.

For example, when the read operation of the first page PG1 is performed, the peripheral circuit 110 may read data from all memory cells included in the first page PG1. Assuming that the first page PG1 is divided into first to m-th chunks CK1 to CKm, all data corresponding to the first to m-th chunks CK1 to CKm may be read and stored in the peripheral circuit 110 during the read operation.

Subsequently, when the decoded address ADDdc is an address of the first chunk CK1, the peripheral circuit 110 may select the first chunk CK1 of data according to the decoded address ADDdc, and output the codeword CDWD corresponding to the first chunk CK1 in response to the operation signals OPS. The input/output circuit 130 may output the codeword CDWD corresponding to the first chunk CK1 to the controller 1200.

The data of the first to m-th chunks CK1 to CKm temporarily stored in the peripheral circuit 110 may be maintained until the read operation of the first page PG1 is completed.

Figure 5:
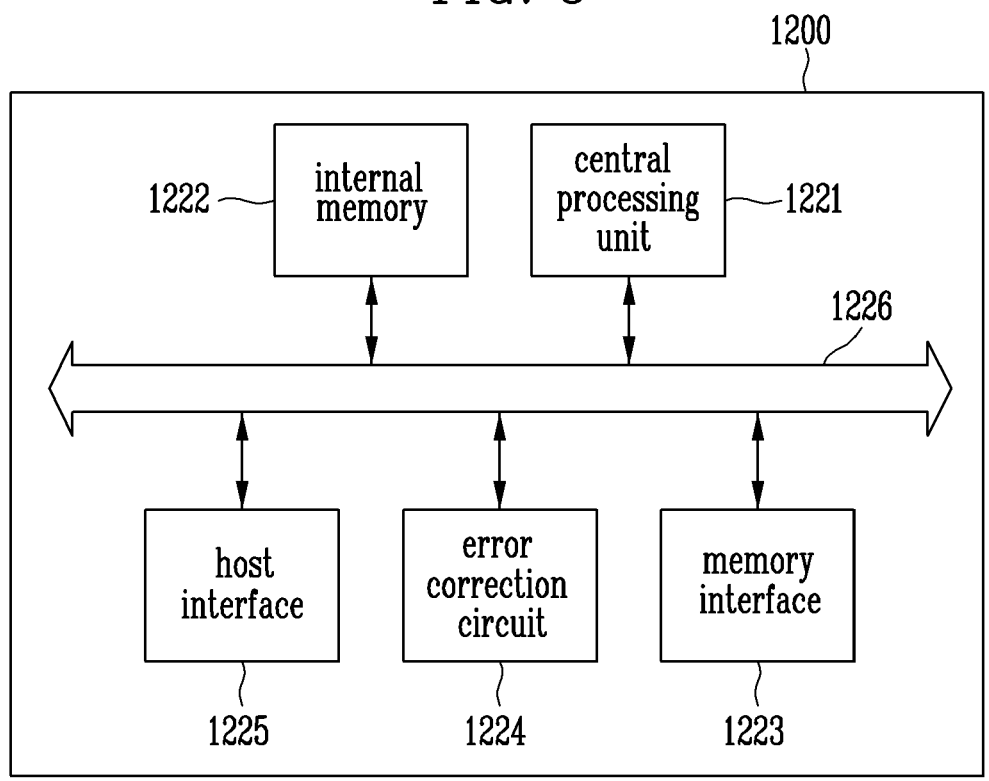
FIG. 5 is a diagram illustrating a controller, such as that shown in FIG. 1.

FIG. 5 is a diagram illustrating the controller shown in FIG. 1.

Referring to FIG. 5, the controller 1200 may include a central processing unit (CPU) 1221, an internal memory 1222, a memory interface 1223, an error correction circuit 1224, and a host interface 1225.

The CPU 1221 may generate a command according to a request of the host, and may control devices included in the controller 1200.

The internal memory 1222 may store system data for an operation of the controller 1200. For example, the internal memory 1222 may store mapping information of a logical address and a physical address, and may store various system data for the operation of the controller 1200.

The memory interface 1223 may transmit a command, an address, and data between the controller 1200 and the memory device 1100 of FIG. 1. For example, the memory interface 1223 may transfer the codeword output from the error correction circuit 1224 to the memory device 1100 or transfer the codeword output from the memory device 1100 to the error correction circuit 1224.

The error correction circuit 1224 may encode data in the form of a message input from the host to output the codeword, and may output the message in which the error is corrected by decoding the codeword input from the memory device. During the read operation, the error correction circuit 1224 may check the codeword input from the memory device in error correction units. When the number of errors is greater than the reference number, the error correction circuit 1224 may output a retransmission request signal to recover the data of the error correction unit in which the error is detected. When the number of errors is equal to or less than the reference number, the memory correction circuit 1224 may correct the error in the error correction unit and output the message.

The host interface 1225 may transmit a command, an address, and data between the controller 1200 and the host. For example, the host interface 1225 may transfer the message output from the host to the error correction circuit 1224 or output the message output from the error correction circuit 1224 to the host.

Figure 6:
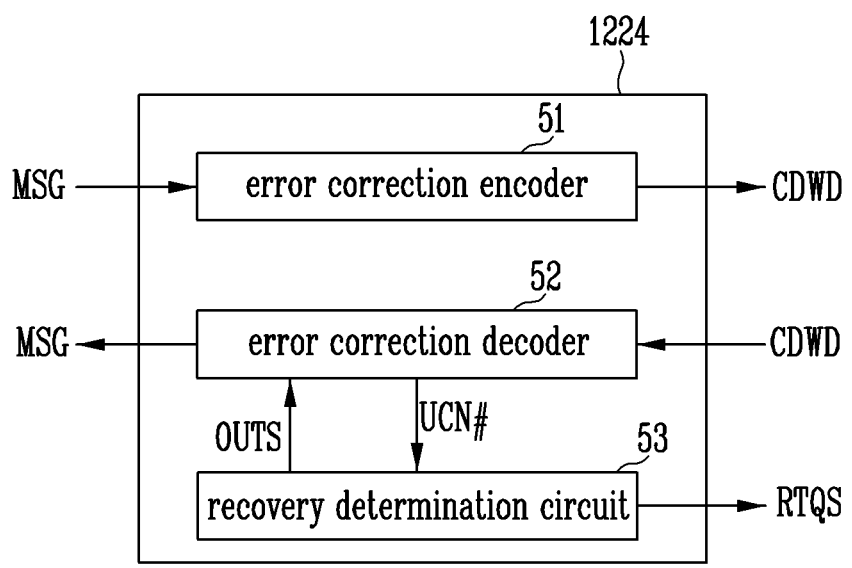
FIG. 6 is a diagram illustrating an error correction circuit, such as that shown in FIG. 5.

FIG. 6 is a diagram illustrating the error correction circuit shown in FIG. 5.

Referring to FIG. 6, the error correction circuit 1224 may perform an error correction encoding operation to convert a message MSG into the codeword CDWD during a program operation, and perform an error correction decoding operation to convert the codeword CDWD into the message MSG during a read operation.

The error correction circuit 1224 may include an error correction encoder 51, an error correction decoder 52, and a recovery determination circuit 53.

The error correction encoder 51 may receive the message MSG that becomes a target of the error correction encoding, and perform the error correction encoding operation using the received message MSG and a matrix of an error correction code ECC. According to an embodiment, the error correction encoder 51 may perform the error correction encoding operation using a parity check matrix of the error correction code. The error correction encoder 51 may output the codeword CDWD generated as a result of performing the error correction encoding operation. The codeword CDWD may be transmitted to the memory device through the input/output lines and may be stored in a plurality of memory cells (for example, memory cells configuring one page) included in the memory device. The error correction encoder 51 may be a low density parity check (LDPC) encoder using an LDPC code as the error correction code.

The error correction decoder 52 may perform the error correction decoding operation using any of various algorithms that employ an iterative decoding scheme. For example, the error correction decoder 52 may perform the error correction decoding operation using a message passing algorithm, also referred to as a belief propagation algorithm. According to an embodiment, the error correction decoder 52 may perform the error correction decoding operation using a parity check matrix. The error correction decoder 52 may perform a plurality of error correction decoding operations and syndrome check operations up to a set maximum iteration number, and may output the message MSG when the error correction decoding operation and the syndrome check operation pass. During the error correction decoding operation, when the number of unsatisfied check nodes (UCNs), represented by a value UCN #, is greater than the reference value, the error correction decoder 52 may output UCN # to the recovery determination circuit 53, and when UCN # is equal to or less than the reference value, the error correction decoder 52 may perform the error correction decoding operation in response to an output signal OUTS and output the message MSG which the error is corrected.

When the UCN # is received, the recovery determination circuit 53 may compare the number of UCNs and the reference number with each other. The recovery determination circuit 53 may output the retransmission request signal RTQS to the memory interface 1223 when the number of UCNs is greater than the reference number as a result of the comparison. The recovery determination circuit 53 may output the output signal OUTS to the error correction decoder 52 when the number of UCNs is equal to or less than the reference number as a result of the comparison.

A method for the error correction decoder 52 to detect the error of the codeword CDWD is described in detail as follows.

Figures 7, 8:
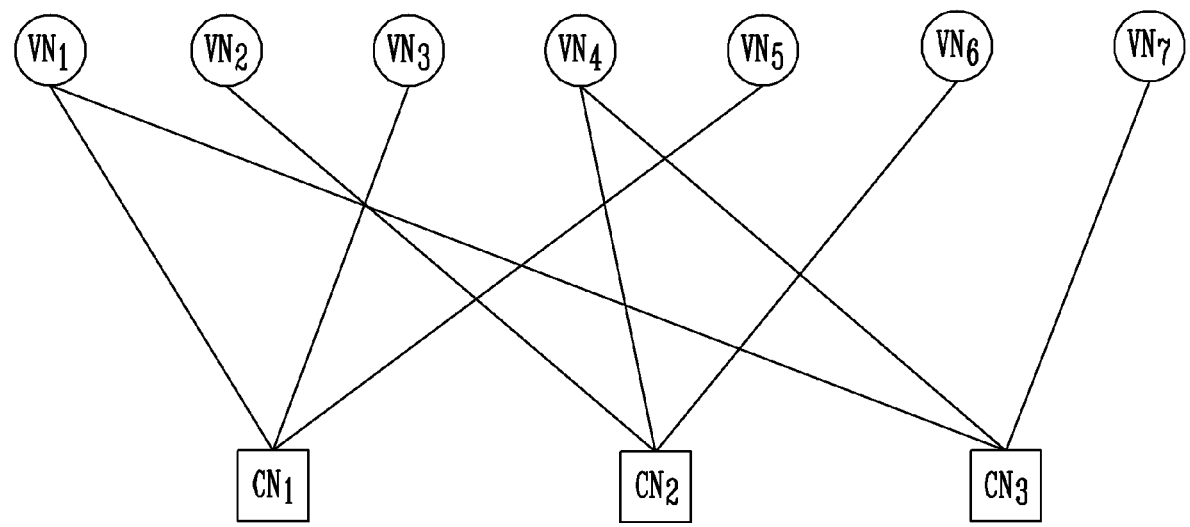
FIG. 7 is a diagram illustrating a parity check matrix according to an embodiment of the present disclosure.
FIG. 8 is a diagram illustrating a Tanner graph that corresponds to the parity check matrix shown in FIG. 7.

FIG. 7 is a diagram illustrating the parity check matrix according to an embodiment of the present disclosure.

Referring to FIG. 7, an example of the parity check matrix H defining (n, k) code is shown.

The (n, k) code may be defined as the parity check matrix H having a size of (n−k)×n. Each entry of the parity check matrix H may be expressed as '0' or '1'. When the number of 1's in the parity check matrix is relatively very small compared to the number of 0's, the (n, k) code may be referred to as (n, k) LDPC code. Here, n and k may be natural numbers. As an example, FIG. 7 shows the parity check matrix H defining a (7, 4) code.

A matrix in which each entry formed of a sub matrix may be referred to as a basic matrix. Each entry of the basic matrix may be a sub matrix of m×m size. Here, m may be an integer equal to or greater than 2. For example, in the basic matrix, '0' may indicate that a corresponding entry is a 0 matrix, and '1' may indicate that the corresponding entry is not a 0 matrix. For example, when the basic matrix is used in a quasi cyclic (QC)-LDPC code, '1' may indicate that the corresponding entry is a cyclic matrix (circulant matrix). The cyclic matrix may be a matrix in which an identity matrix is cyclic shifted by a set shift value. Different cyclic matrices may have different shift values.

FIG. 8 is a diagram illustrating a Tanner graph that corresponds to the parity check matrix shown in FIG. 7.

Referring to FIG. 8, the (n, k) code may be expressed by the Tanner graph, which is an equivalent bipartite graph expression. The Tanner graph may be expressed by n−k check nodes, n variable nodes, and edges. The check nodes correspond to rows of the parity check matrix, and the variable nodes correspond to columns of the parity check matrix. Each edge connects one check node and one variable node and indicates an entry expressed by '1' in the parity check matrix.

The parity check matrix of (7, 4) code shown in FIG. 7 may be expressed by a Tanner graph including three check nodes CN1 to CN3 and seven variable nodes VN1 to VN7 as shown in FIG. 8. A solid line connecting the check nodes CN1 to CN3 and the variable nodes VN1 to VN7 indicates the edge.

Iterative decoding may be performed according to an iterative message transfer algorithm between the check nodes CN1 to CN3 and the variable nodes VN1 to VN7 on the Tanner graph. That is, the iterative decoding may be performed while a message is transferred between the check nodes CN1 to CN3 and the variable nodes VN1 to VN7 for each iteration.

The variable nodes VN1 to VN7 may perform error correction using check-node-to-variable-node (C2V) messages received from the check nodes CN1 to CN3 connected to the variable nodes VN1 to VN7. The variable nodes VN1 to VN7 may generate variable-node-to-check-node (V2C) messages to be transmitted to the check nodes CN1 to CN3 connected to the variable nodes VN1 to VN7, and transmit the generated V2C messages to the corresponding check nodes CN1 to CN3, respectively.

The check nodes CN1 to CN3 may perform a parity check operation using the V2C messages received from the variable nodes VN1 to VN7 connected to the check nodes CN1 to CN3. A code bit included in the V2C message may be used in the parity check operation. The check nodes CN1 to CN3 may generate the C2V messages to be transmitted to the variable nodes VN1 to VN7 connected to the check nodes CN1 to CN3, and transmit the generated C2V messages to the corresponding variable nodes VN1 to VN7, respectively.

FIG. 9 is a diagram illustrating a method of generating a symbol using the parity check matrix shown in FIG. 7, and FIG. 10 is a diagram illustrating symbols and the unsatisfied check node (UCN) according to an embodiment of the present disclosure.

Referring to FIGS. 9 and 10, symbols Si1 to Si3 may be generated based on the parity check matrix H of FIG. 7 and a transposition matrix $Ci^T$ of variable node vectors Ci1 to Ci7 corresponding to an i-th iteration.

When all symbols Si1, Si2, and Si3 of a syndrome Si are 0, this means that the syndrome check operation is passed, and means that the error correction decoding is successful in the corresponding iteration. Therefore, the iterative decoding operation on the codeword may be ended, and the variable node vectors Ci1 to Ci7 corresponding to the i-th iteration may be output as the message MSG.

When at least one symbol among all symbols Si1, Si2, and Si3 of the syndrome Si is not 0, this means that the syndrome check operation is failed. Since this means that the error correction decoding is failed in the corresponding iteration, a next iteration decoding operation may be performed when a maximum iteration number is not reached. Here, a symbol other than 0 indicates the UCN. For example, when two symbols corresponding to 1 are included among the symbols included in the syndrome, the UCN value UCN # becomes 2, and when one symbol corresponding to 1 is included in the next generated syndrome, the UCN value UCN # becomes 1. Therefore, an accumulated UCN value UCN # may become 3.

Figure 11:
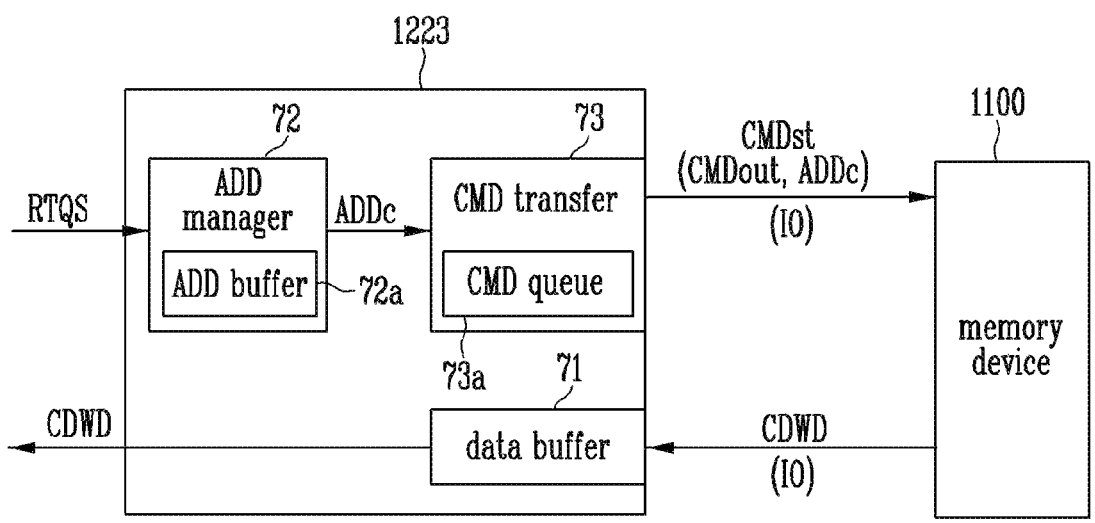
FIG. 11 is a diagram illustrating a memory interface, such as that shown in FIG. 5.

FIG. 11 is a diagram illustrating the memory interface shown in FIG. 5.

Referring to FIG. 11, the memory interface 1223 may include a data buffer 71, an address manager (ADD manager) 72, and a command transmitter (CMD transfer) 73.

The data buffer 71 may temporarily store the codeword CDWD output from the memory device 1100, and transmit the stored codeword CDWD to the error correction circuit 1224 in error correction units, each of which is a portion of the codeword CDWD.

The address manager 72 may output a column address ADDc currently buffered therein, in response to the retransmission request signal RTQS. For example, the address manager 72 may store the column address ADDc of the error correction unit on which the error correction decoding operation is currently performed by the error correction circuit 1224, and may output the column address ADDc of the error correction unit when the retransmission request signal RTQS is input thereto. The column address ADDc may be of the error correction unit on which the error correction decoding operation is performed in the error correction circuit 1224.

To this end, the address manager 72 may include an address buffer (ADD buffer) 72a capable of storing the column address ADDc of the error correction unit of the codeword CDWD on which the error correction decoding operation is currently performed. The address buffer 72a may store the column address of the N-bit error correction unit of the codeword CDWD on which the error correction decoding operation is performed in the error correction circuit 1224. When the column address ADDc of the error correction unit of the codeword CDWD on which the error correction decoding operation is performed is changed, the address buffer 72a may update the column address ADDc to the changed column address ADDc. That is, the column address ADDc currently stored in the address buffer 72a may be an address corresponding to the N-bit error correction unit of the codeword CDWD on which the error correction decoding operation is currently performed.

When the command transmitter 73 receives the column address ADDc output from the address manager 72, the command transmitter 73 may output the command set CMDst including the received column address ADDc and the output command CMDout. For example, the command transmitter 73 may include a command queue (CMD queue) 73a that queues and stores a plurality of commands output to the memory device 1100. The command queue 73a may delete a command for an operation that has been completed in the memory device 1100 and store a command that is being executed in the memory device 1100. For example, during the read operation, the command queue 73a may output a read command to the memory device 1100, and when the memory device 1100 outputs a signal that the read operation is completed, the command queue 73a may delete the read command. When the read command is deleted, the command queue 73a may output the output command CMDout to the memory device 1100. The memory device 1100 may output the codeword of the error correction unit in response to the output command CMDout, and the codeword of the error correction unit output from the memory device 1100 may be input to the data buffer 71.

As a result of the decoding operation of the error correction circuit 1224 of FIG. 6, when no error is detected in the codeword CDWD or when the error is correctable, the message MSG may be output, and when the message MSG is output, a data output operation may be ended. When the data output operation ends, the output command CMDout stored in the command queue 73a may be deleted, but the command queue 73a may store the output command CMDout until the data output operation ends.

The memory device 1100 may select the codeword CDWD of the error correction unit corresponding to the column address ADDc included in the command set CMDst and output the codeword CDWD of the error correction unit again in response to the output command CMDout. For example, the memory device 1100 may selectively output the codeword CDWD of the error correction unit corresponding to the column address ADDc without outputting the entire codeword CDWD having the size of the page again, and thus an operation time for outputting the codeword CDWD may be shortened. That is, since the number of input/output lines IO on which the codeword CDWD is loaded is limited, the number of bits of the codeword CDWD simultaneously output is limited according to the number of input/output lines IO. Accordingly, as the number of bits of the codeword CDWD to be output decreases, e.g., to the number of bits of the error correction unit, the time for outputting the codeword CDWD may also decrease.

Figure 12:
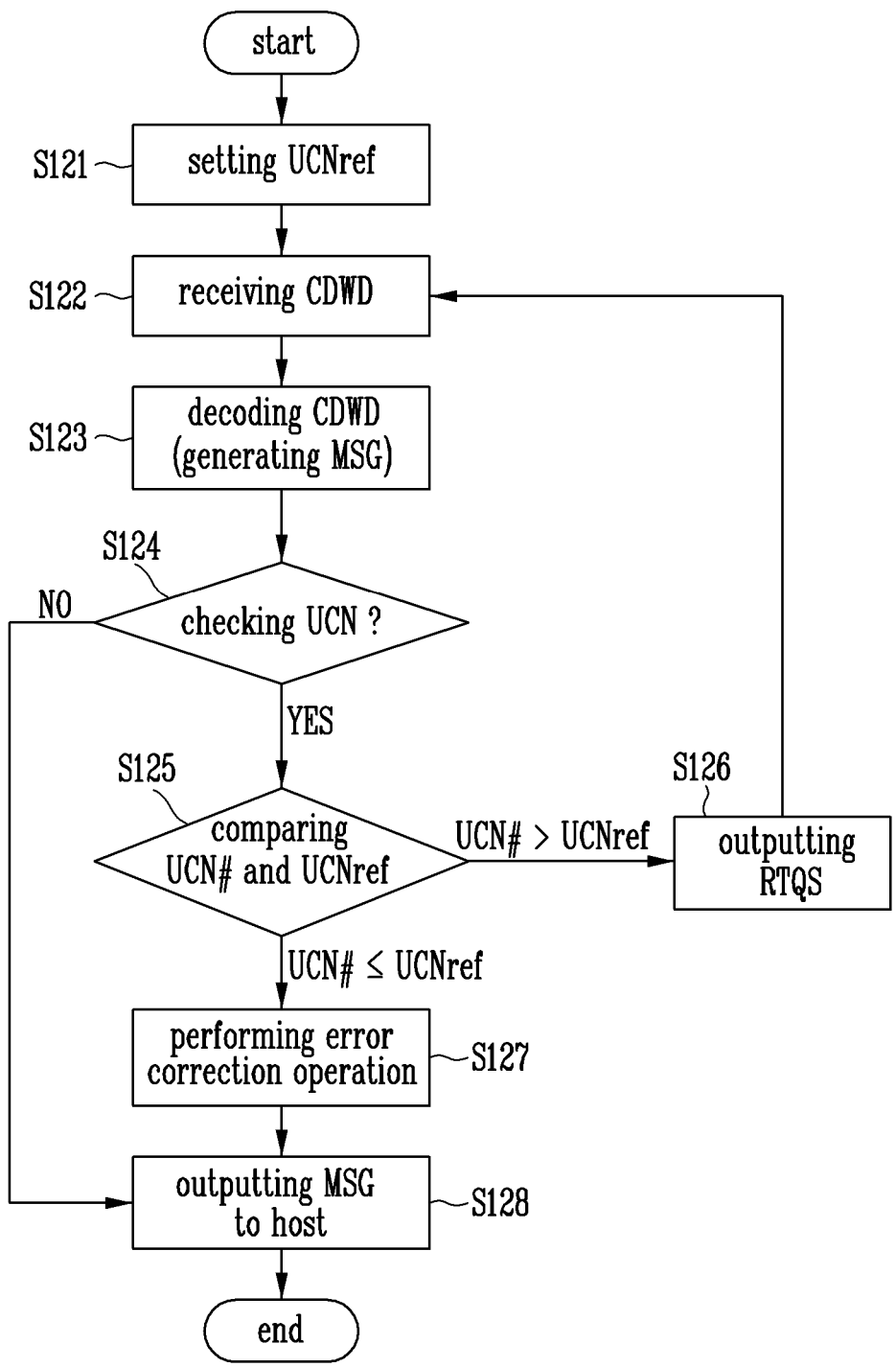
FIG. 12 is a flowchart illustrating an error recovery operation according to an embodiment of the present disclosure.

FIG. 12 is a flowchart illustrating an error recovery operation according to an embodiment of the present disclosure.

Referring to FIG. 12, the error recovery operation may be performed by the error correction circuit 1224 shown in FIG. 6. In the error correction circuit 1224, a reference value UCNref, representing the error correction capability of the error correction circuit 1224 may be set in advance (S121). The reference value UCNref may be set differently for different error correction decoding algorithms that the error correction circuit 1224 may execute. Since complexity of the error correction decoding operation increases as the reference value UCNref increases, the reference value UCNref may be set according to an error correction capability of the error correction circuit 1224. UCNref may represent the number of errors that the error correction circuit 1224 is capable of correcting.

The error correction circuit 1224 receives the codeword CDWD from the memory device (S122). The codeword CDWD may be data read from the memory device. For example, the codeword CDWD may be data corresponding to an address transmitted to the memory device during the read operation. More specifically, the codeword CDWD may be data read from the page selected according to the address in the memory device. That is, the codeword CDWD may be the size of a page.

The error correction circuit 1224 may decode the codeword CDWD (S123). For example, the error correction decoder 52 included in the error correction circuit 1224 may perform the error correction decoding operation when the codeword CDWD is input. The error correction decoding operation may be performed according to the method described with reference to FIGS. 7 to 9.

The error correction circuit 1224 may check the number of UCNs detected in the error correction decoding operation (S124). When no UCN is detected (NO), the error correction circuit 1224 may output the message MSG generated by the error correction decoding operation to the host (S128).

In step S124, when at least one UCN is detected (YES), the error correction circuit 1224 may compare the UCN value UCN # corresponding to the number of detected UCNs with the reference value UCNref (S125).

As a result of the comparison of step S125, when the UCN value UCN # for an error correction unit of the codeword is greater than the reference value UCNref (UCN #>UCNref), the error correction circuit 1224 may output the retransmission request signal RTQS (S126). When the retransmission request signal RTQS is output, the memory interface 1223 of FIG. 11 may output the command set CMDst including the column address ADDc for the error correction unit corresponding to the UCN # and the output command CMDout, and the memory device 1100 of FIG. 11 may selectively output the error correction unit portion of the codeword CDWD corresponding to the column address ADDc in response to the command set CMDst. The column address ADDc may be an address divided in the error correction unit. Therefore, the memory device 1100 may output the error correction unit portion of the codeword CDWD, selected by the column address ADDc, again.

When the memory device 1100 outputs the selected error correction unit portion of the codeword CDWD again, the error correction circuit 1224 may receive the same again (S122) and perform the error correction decoding operation on the error correction unit portion of the codeword CDWD again (S123). In step S125, steps S122 to S126 may be repeated until the UCN value UCN # is equal to or less than the reference value UCNref.

When the UCN value UCN # is equal to or less than the reference value UCNref in step S125, the error correction circuit 1224 may perform the error correction operation (S127), and output the message MSG in which the error is corrected to the host (S128).

Figure 13:
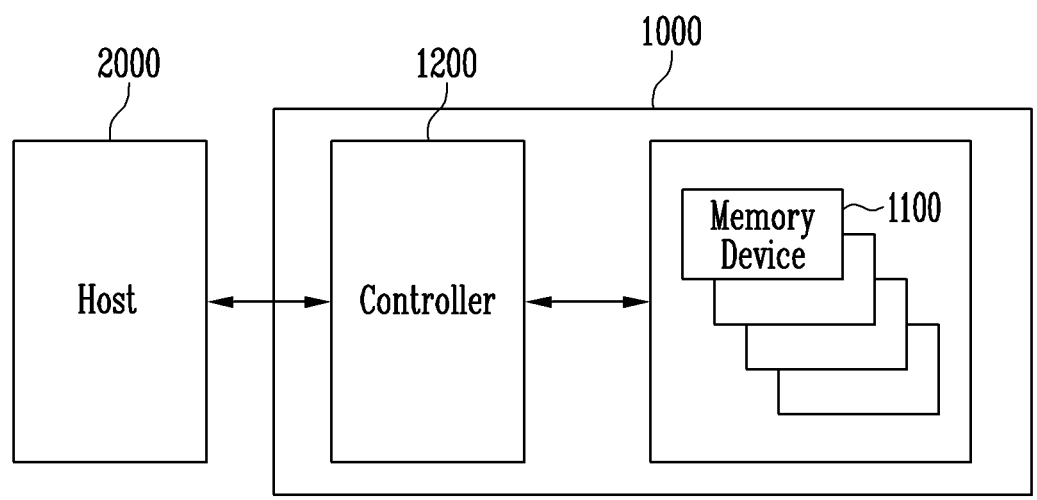
FIG. 13 is a diagram illustrating a memory system including a controller according to an embodiment of the present disclosure.

FIG. 13 is a diagram illustrating an embodiment of a memory system including the controller according to an embodiment of the present disclosure.

Referring to FIG. 13, the memory system 1000 may include memory device(s) 1100 in which data is stored, and the controller 1200 communicating between the memory device(s) 1100 and the host 2000.

The memory system 1000 may include a plurality of memory devices 1100, each of which may be connected to the controller 1200 through at least one channel. For example, each of memory devices 1100 may be connected to the controller 1200 via a dedicated channel, sets of memory devices 1100 may be connected to the controller 1200 through the same channel, or all of the memory devices 1100 may be connected to the controller via a common channel.

The controller 1200 may communicate with the host 2000 and the memory device 1100 and provide a communication path between the two. The controller 1200 may control the memory device 1100 according to a request of the host 2000 or may perform a background operation for performance improvement of the memory system 1000 without a request from the host 2000. The host 2000 may generate requests for various operations and output the generated requests to the memory system 1000. For example, the requests may include a program request that may control a program operation, a read request that may control a read operation, an erase request that may control an erase operation, and the like.

The host 2000 may communicate with the memory system 1000 through any of various interfaces, such as peripheral component interconnect express (PCIe), advanced technology attachment (ATA), serial ATA (SATA), parallel ATA (PATA), serial attached small computer system interface (SCSI) (SAS), non-volatile memory express (NVMe) a universal serial bus (USB), a multi-media card (MMC), an enhanced small disk interface (ESDI), or integrated drive electronics (IDE).

Figure 14:
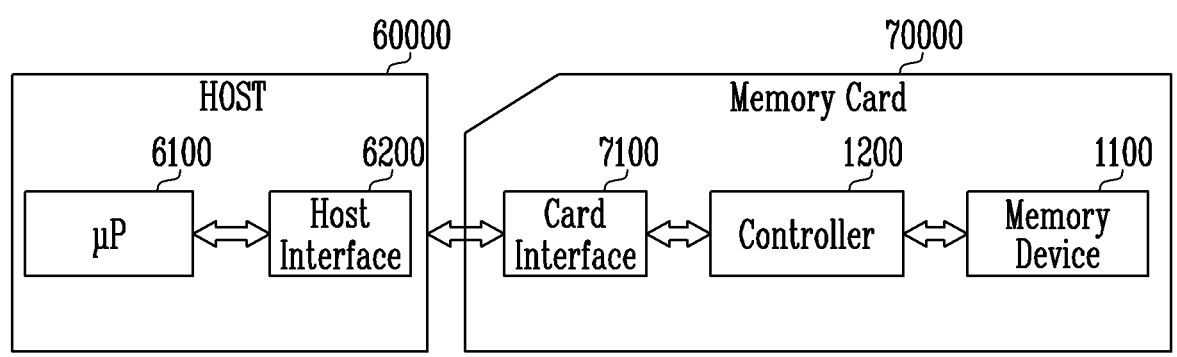
FIG. 14 is a diagram illustrating a memory system including a controller according to another embodiment of the present disclosure.

FIG. 14 is a diagram illustrating the memory system including the controller according to another embodiment of the present disclosure.

Referring to FIG. 14, the memory system 70000 may be implemented as a memory card or a smart card. The memory system 70000 may include the memory device 1100, the controller 1200, and a card interface 7100.

The controller 1200 may control data exchange between the memory device 1100 and the card interface 7100. According to an embodiment, the card interface 7100 may be a secure digital (SD) card interface or a multi-media card (MMC) interface, but the present invention is not limited thereto.

The card interface 7100 may interface data exchange between a host 60000 and the controller 1200 according to a protocol of the host 60000. According to an embodiment, the card interface 7100 may support a universal serial bus (USB) protocol and an inter chip (IC)-USB protocol. Here, the card interface 7100 may refer to hardware capable of supporting a protocol that is used by the host 60000, software installed in the hardware, or a signal transmission method. The host 60000 may be a PC, a tablet PC, a digital camera, a digital audio player, a mobile phone, a console video game hardware, or a digital set-top box.

When the memory system 70000 is connected to a host interface 6200 of the host 60000, the interface 6200 may perform data communication with the memory device 1100 through the card interface 7100 and the controller 1200 under control of a microprocessor (μP) 6100.

What is claimed is:

1. A controller comprising:
   a memory interface configured to receive a codeword from a memory device; and
   an error correction circuit configured to:
   perform an error correction decoding operation on the codeword received from the memory interface,
   compare a number of unsatisfied check nodes (UCNs) detected in the error correction decoding operation with a reference number,
   perform or stop the error correction decoding operation on the codeword according to a result of comparing the number of UCNs and the reference number, and
   output a retransmission request signal of the codeword to the memory interface in response to the result,
   wherein the memory interface requests the codeword to the memory device in response to the retransmission request signal.

2. The controller of claim 1, wherein the error correction circuit is configured to stop the error correction decoding operation and output the retransmission request signal when the number of UCNs is greater than the reference number.

3. The controller of claim 1, wherein the error correction circuit is configured to perform the error correction decoding operation or output a message in which an error of the codeword is corrected to a host when the number of UCNs is equal to or less than the reference number.

4. The controller of claim 1, wherein the error correction circuit comprises:
   an error correction encoder configured to generate the codeword by encoding a message received from a host;
   an error correction decoder configured to perform the error correction decoding operation on the codeword and output the number of UCNs detected during the error correction decoding operation; and
   a recovery determination circuit configured to:
   compare the number of UCNs and the reference number with each other,
   output the retransmission request signal when the number of UCNs is greater than the reference number as a result of the comparison, and
   output an output signal when the number of UCNs is equal to or less than the reference number as a result of the comparison.

5. The controller of claim 4, wherein the error correction decoder performs a decoding operation of calculating a parity check matrix with the codeword, outputs the number of UCNs to the recovery determination circuit when at least one UCN is detected among symbols generated as a result of the error correction decoding operation, and outputs the message by correcting an error of the codeword in response to the output signal.

6. The controller of claim 5, wherein the recovery determination circuit compares the number of the UCNs and the reference number with each other, outputs the output signal to the error correction decoder when the number of UCNs is equal to or less than the reference number, and outputs the retransmission request signal to the memory interface when the number of UCNs is greater than the reference number.

7. The controller of claim 1, wherein the memory interface comprises:
   a data buffer configured to divide data received from the memory device into a unit of the codeword for performing the error correction decoding operation and transmit the codeword to the error correction circuit;
   an address manager configured to store a column address of the codeword on which the error correction decoding operation is performed, and output the column address when the retransmission request signal is received; and
   a command transmitter configured to queue commands transmitted to the memory device and output an output command among the queued commands and the column address as a command set when the column address is input thereto.

8. The controller of claim 7, wherein the address manager includes an address buffer storing the column address for the codeword, and outputs the stored column address when the retransmission request signal is input thereto.

9. The controller of claim 7, wherein the command transmitter includes a command queue for queuing the commands transmitted to the memory device.

10. The controller of claim 9, wherein when an operation corresponding to the command transmitted to the memory device is ended, the command queue deletes the ended command.

11. The controller of claim 10, wherein the command queue stores an output command corresponding to the codeword until an error correction decoding operation on the codeword output from the memory device is completed during a read operation.

12. A memory system comprising:
    a memory device configured to store data including a codeword; and
    a controller configured to control the memory device,
    wherein the controller comprises:
    a memory interface configured to receive the codeword from the memory device; and
    an error correction circuit configured to:
    perform an error correction decoding operation on the codeword received from the memory interface,
    compare a number of unsatisfied check nodes (UCNs) detected in the error correction decoding operation with a reference number,
    perform or stop the error correction decoding operation on the codeword according to a result of comparing the number of UCNs and the reference number, output a retransmission request signal of the codeword when the error correction decoding operation is stopped, and the memory interface requests first data of the codeword to the memory device in response to the retransmission request signal.

13. The memory system of claim 12, wherein the memory device outputs read data by performing a read operation on a selected page in response to a read command and a page address output from the controller, and selectively outputs the first data of the codeword in response to an output command and a column address output from the controller, the column address corresponding to the first data.

14. The memory system of claim 13, wherein the memory device comprises:
    a peripheral circuit configured to read all data of the selected page in response to the read command and temporarily store the read data; and
    an input/output circuit configured to output the first data corresponding to the column address in response to the output command.

15. The memory system of claim 12, wherein the error correction circuit comprises:
    an error correction encoder configured to generate the codeword by encoding a message received from a host;
    an error correction decoder configured to perform the error correction decoding operation on the codeword and output the number of UCNs detected during the error correction decoding operation; and
    a recovery determination circuit configured to:
    compare the number of UCNs and the reference number with each other,
    output the retransmission request signal when the number of UCNs is greater than the reference number as a result of the comparison, and
    output an output signal when the number of UCNs is equal to or less than the reference number as a result of the comparison.

16. The memory system of claim 15, wherein the error correction decoder performs a decoding operation of calculating a parity check matrix with the codeword, outputs the number of UCNs to the recovery determination circuit when the UCN is detected among symbols generated as a result of the error correction decoding operation, perform the error correction decoding operation and outputs the message by correcting an error of the codeword in response to the output signal when the output signal is output from the recovery determination circuit.

17. The memory system of claim 16, wherein the recovery determination circuit counts the number of UCNs received from the error correction decoder, compares the number of the UCNs and the reference number with each other, outputs the output signal to the error correction decoder when the number of UCNs is equal to or less than the reference number, and outputs the retransmission request signal to the memory interface when the number of UCNs is greater than the reference number.

18. The memory system of claim 12, wherein the memory interface comprises:
    a data buffer configured to divide data received from the memory device into a unit of the codeword for performing the error correction decoding operation and transmit the codeword to the error correction circuit;
    an address manager configured to store a column address of the codeword on which the error correction decoding operation is performed, and output the column address when the retransmission request signal is received; and
    a command transmitter configured to queue commands transmitted to the memory device and output an output command among the queued commands and the column address as a command set when the column address is input thereto.

19. The memory system of claim 18, wherein the address manager includes an address buffer storing the column address for the codeword, and outputs the stored column address when the retransmission request signal is input thereto.

20. An operating method of a controller, the operating method comprising:
    controlling a memory device to read therefrom a codeword comprising data pieces;
    performing an error correction decoding operation on each of the data pieces;
    controlling, when a number of unsatisfied check nodes is greater than a threshold as a result of performing the error correction decoding operation on a target data piece among the data pieces, the memory device to read therefrom the target data piece; and
    performing the error correction decoding operation on the target data piece again.

* * * * *